(12) United States Patent
Isono et al.

(10) Patent No.: US 10,756,281 B2
(45) Date of Patent: Aug. 25, 2020

(54) IMAGING DEVICE

(71) Applicant: Panasonic Intellectual Property Management Co., Ltd., Osaka (JP)

(72) Inventors: Shunsuke Isono, Osaka (JP); Akio Nakajun, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 39 days.

(21) Appl. No.: 16/247,698

(22) Filed: Jan. 15, 2019

(65) Prior Publication Data

US 2019/0237691 A1 Aug. 1, 2019

(30) Foreign Application Priority Data

Jan. 31, 2018 (JP) .................................. 2018-014386
Feb. 14, 2018 (JP) .................................. 2018-024166

(51) Int. Cl.
*H01L 27/146* (2006.01)
*H01L 51/42* (2006.01)

(52) U.S. Cl.
CPC .......... *H01L 51/42* (2013.01); *H01L 27/1462* (2013.01); *H01L 27/14603* (2013.01); *H01L 27/14621* (2013.01); *H01L 27/14627* (2013.01); *H01L 27/14665* (2013.01); *H01L 27/14683* (2013.01)

(58) Field of Classification Search
CPC .......... H01L 27/14603; H01L 27/1462; H01L 27/14621; H01L 27/14627; H01L 27/14665; H01L 27/14683; H01L 27/307; H01L 51/42

USPC .......................................................... 257/40
See application file for complete search history.

(56) References Cited

U.S. PATENT DOCUMENTS

2006/0011813 A1    1/2006   Park et al.
2007/0012955 A1    1/2007   Ihama
2012/0268631 A1   10/2012   Takase et al.
(Continued)

FOREIGN PATENT DOCUMENTS

| JP | 2000-150846 | 5/2000 |
|---|---|---|
| JP | 2006-032967 | 2/2006 |
| JP | 2007-012796 | 1/2007 |

(Continued)

*Primary Examiner* — Long K Tran
(74) *Attorney, Agent, or Firm* — McDermott Will & Emery LLP (57) ABSTRACT

An imaging device includes a semiconductor substrate that includes a pixel region where pixels are arranged and a peripheral region adjacent to the pixel region; an insulating layer that covers the pixel region and the peripheral region; a first electrode that is located on the insulating layer above the pixel region; a photoelectric conversion layer that covers the first electrode; a second electrode that covers the photoelectric conversion layer; and a first layer that covers the second electrode, the first layer being located above the pixel region and the peripheral region. A thickness of the first layer above the peripheral region is larger than a thickness of the first layer above the pixel region. A level of an uppermost surface of the first layer above the peripheral region is higher than a level of an uppermost surface of the first layer above the pixel region.

17 Claims, 3 Drawing Sheets

(56) References Cited

U.S. PATENT DOCUMENTS

| | | | |
|---|---|---|---|
| 2015/0002719 A1* | 1/2015 | Isono | H01L 27/307 348/311 |
| 2016/0043144 A1* | 2/2016 | Sato | H01L 27/14601 438/59 |

FOREIGN PATENT DOCUMENTS

| | | |
|---|---|---|
| JP | 2007-134664 | 5/2007 |
| JP | 2011-071483 | 4/2011 |
| JP | 2012-227476 | 11/2012 |

* cited by examiner

IMAGING DEVICE

BACKGROUND

1. Technical Field

The present disclosure relates to an imaging device.

2. Description of the Related Art

Japanese Patent No. 5637751 discloses a stacked organic imaging device. In such a stacked organic imaging device, a photoelectric conversion film made of an organic semiconductor material, i.e., an organic film is stacked on a semiconductor substrate.

SUMMARY

An imaging device in which a defect such as film peeling is less likely to occur is desired.

In one general aspect, the techniques disclosed here feature an imaging device including: a semiconductor substrate that includes a pixel region where pixels are arranged and a peripheral region adjacent to the pixel region; an insulating layer that covers the pixel region and the peripheral region; a first electrode that is located on the insulating layer above the pixel region; a photoelectric conversion layer that covers the first electrode; a second electrode that covers the photoelectric conversion layer; and a first layer that covers the second electrode, the first layer being located above the pixel region and the peripheral region, wherein a thickness of the first layer above the peripheral region is larger than a thickness of the first layer above the pixel region, and a level of an uppermost surface of the first layer above the peripheral region is higher than a level of an uppermost surface of the first layer above the pixel region.

It should be noted that general or specific embodiments may be implemented as an element, a device, an apparatus, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of the Present Disclosure

In a stacked organic imaging device, a photoelectric conversion layer is made of an organic semiconductor material. The photoelectric conversion layer is formed by vacuum vapor deposition. In vacuum vapor deposition, in a case where a pattern of a photoelectric conversion layer is formed, a shadow mask such as a metal mask opened at a position where the photoelectric conversion layer is to be formed is used. In a case where a foreign substance is on the metal mask, the foreign substance is sometimes transferred onto a wafer when the photoelectric conversion layer is formed.

Use of etching, ashing, and chemical cleaning used for conventional semiconductor device production has a risk of decomposing the organic semiconductor material in the photoelectric conversion layer. It is therefore hard to remove the foreign substance transferred from the mask onto the wafer by etching, ashing, and chemical cleaning. For this reason, in a stacked organic imaging device, a foreign substance sometimes remains in a region other than a photoelectric conversion layer.

As a result, unevenness of a surface of the imaging device created by the foreign substance sometimes causes the foreign substance to be detached in a later process, leading to a defect such as film peeling.

In the imaging device described in Japanese Patent No. 5637751, an overcoat layer is provided on a color filter in a range from a pixel part to a peripheral part. This pixel part is a part where the photoelectric conversion layer is located in a plan view. In the imaging device described in Japanese Patent No. 5637751, a level of an uppermost surface of the peripheral part is the same as or lower than a level of an uppermost surface of the pixel part. In the imaging device described in Japanese Patent No. 5637751, in a case where a foreign substance is attached to the peripheral part, it is hard to make an uppermost surface of the imaging device flat by completely covering unevenness created by the foreign substance with an overcoat layer. That is, a defect such as film peeling sometimes occurs due to unevenness created on the surface of the imaging device by the foreign substance.

As a result of diligent studies in view of the above problem, the inventors of the present invention found that unevenness created by a foreign substance can be flattened by forming a protection film having a large thickness in a peripheral part where a foreign substance is easily attached. The inventors of the present invention found that occurrence of a defect such as film peeling can be thus made less likely without impairing properties of a pixel.

An aspect of the present disclosure is summarized as follows.

Item 1

An imaging device including:

a semiconductor substrate that includes a pixel region where pixels are arranged and a peripheral region adjacent to the pixel region;

an insulating layer that covers the pixel region and the peripheral region;

a first electrode that is located on the insulating layer above the pixel region;

a photoelectric conversion layer that covers the first electrode;

a second electrode that covers the photoelectric conversion layer; and a first layer that covers the second electrode, the first layer being located above the pixel region and the peripheral region, wherein a thickness of the first layer above the peripheral region is larger than a thickness of the first layer above the pixel region, and a level of an uppermost surface of the first layer above the peripheral region is higher than a level of an uppermost surface of the first layer above the pixel region.

Item 2

The imaging device according to Item 1, wherein a thickness of the first layer above a part of the peripheral region is larger than the thickness of the first layer above the pixel region, the part not overlapping the photoelectric conversion layer in a plan view.

Item 3

The imaging device according to Item 1 or 2, wherein the pixels are configured to detect an intensity of incident light.

Item 4

The imaging device according to any one of Items 1 to 3, further comprising a detection circuit that is coupled to the first electrode and that is configured to detect a signal from the first electrode.

Item 5

The imaging device according to any one of Items 1 to 4, further comprising an amplification transistor having a gate coupled to the first electrode.

Item 6

The imaging device according to any one of Items 1 to 5, further comprising a microlens that is located above the second electrode above the pixel region, wherein the level the uppermost surface of the first layer above the peripheral region is higher than a level of an uppermost surface of the microlens.

Item 7

The imaging device according to any one of Items 1 to 6, wherein the level of the uppermost surface of the first layer above the peripheral region is higher than levels of uppermost surfaces of the pixels on the pixel region.

Item 8

The imaging device according to any one of Items 1 to 7, wherein the first layer includes:
 a second layer that covers the pixel region and the peripheral region, and
 a third layer that is located on the second layer, the third layer covering the peripheral region and not covering the pixel region.

Item 9

The imaging device according to Item 8, wherein the second layer includes a plurality of layers.

Item 10

The imaging device according to Item 8 or 9, wherein the second layer includes a layer that constitutes a color filter.

Item 11

The imaging device according to Item 8 or 9, wherein the second layer includes a layer that constitutes a microlens.

Item 12

The imaging device according to any one of Items 8 to 11, wherein the third layer includes a plurality of layers.

Item 13

The imaging device according to any one of Items 8 to 12, wherein the photoelectric conversion layer extends above the peripheral region; and the third layer overlaps the photoelectric conversion layer in a plan view.

Item 14

The imaging device according to any one of Items 8 to 13, wherein a thickness of the third layer is larger than a thickness of the photoelectric conversion layer.

Item 15

The imaging device according to any one of Items 8 to 14, further comprising a microlens located above the pixel region, wherein
a thickness of the third layer is larger than a thickness of the microlens.

Item 16

The imaging device according to any one of Items 8 to 15, wherein light transmittance of the third layer in a wavelength range of 400 nm or more and 600 nm or less is 20% or less.

Item 17

The imaging device according to any one of Items 8 to 16, wherein a thickness of the third layer is 3 µm or more and 20 µm or less.

An imaging device according to an aspect of the present disclosure includes a semiconductor substrate, a pixel part where a plurality of pixels are arranged in a matrix on the semiconductor substrate, a peripheral part disposed around the pixel part in a plan view and includes a peripheral circuit, and a protection film that is selectively disposed on an upper side of the peripheral part only; each of the plurality of pixels includes a photoelectric conversion part including a lower electrode, an upper electrode facing the lower electrode, and a photoelectric conversion layer located between the lower electrode and the upper electrode; and an uppermost surface of the protection film is located higher than an uppermost surface of the pixel part.

According to the above configuration, the protection film selectively covers an upper side of the peripheral part only. This makes it possible to flatten unevenness of the uppermost surface of the peripheral part created by attachment of a foreign substance. As a result, occurrence of a defect such as film peeling can be made less likely. Furthermore, according to the above configuration, in which the protection film selectively covers an upper side of the peripheral part only, pixel properties are less affected.

For example, the imaging device according to the aspect of the present disclosure may be configured such that the photoelectric conversion part extends to a position that overlaps the protection film in a plan view.

According to the above configuration, the peripheral part of the photoelectric conversion part is covered with the protection film. This can improve adhesion among the upper electrode, the photoelectric conversion layer, the lower electrode, and an insulating layer.

An imaging device according to an aspect of the present disclosure includes a semiconductor substrate, and a photoelectric conversion part that is located on the semiconductor substrate and includes a lower electrode, an upper electrode facing the lower electrode, and a photoelectric conversion layer located between the lower electrode and the upper electrode; the imaging device has a first region and a second region that surrounds the first region; the photoelectric conversion part covers the first region and the second region in a plan view; the imaging device includes a protection film that overlaps the second region in a plan view; and an uppermost surface of the protection film is located higher than an uppermost surface of the imaging device in the first region.

According to the above configuration, unevenness of the uppermost surface of the second region created by attachment of a foreign substance can be flattened. As a result, occurrence of a defect in a later step can be made less likely. Furthermore, according to the above configuration, in which the peripheral part of the photoelectric conversion part is covered with the protection film, adhesion among the upper electrode, the photoelectric conversion layer, the lower electrode, and the insulating layer can be improved.

For example, the imaging device according to the aspect of the present disclosure may be configured such that a thickness of the protection film is larger than a thickness of the photoelectric conversion layer.

According to the above configuration, unevenness of the uppermost surface of the peripheral part created by attachment of a foreign substance can be flattened. As a result, occurrence of a defect such as film peeling can be made less likely.

For example, the imaging device according to the aspect of the present disclosure may be configured to further include a microlens located above the photoelectric conversion part, wherein a thickness of the protection film is larger than a thickness of the microlens.

According to the above configuration, unevenness of the uppermost surface of the peripheral part created by attachment of a foreign substance can be flattened. As a result, occurrence of a defect such as film peeling can be made less likely.

The imaging device according to the aspect of the present disclosure may be configured such that light transmittance of the protection film in a wavelength region of not less than 400 nm and not more than 600 nm is 20% or less.

According to the above configuration, influence of light entering a circuit disposed in the peripheral part can be reduced.

An embodiment of the present disclosure is described in detail below with reference to the drawings.

An embodiment described below is a general or specific example of the present disclosure. Numerical values, shapes, materials, constituent elements, the way in which the constituent elements are disposed and coupled, steps, the order of steps, and the like are examples and do not limit the present disclosure. Various aspects described herein can be combined as long as no contradiction occurs. Among constituent elements in the embodiment below, constituent elements that are not described in independent claims indicating highest concepts are described as optional constituent elements. In the following description, constituent elements having substantially identical functions are given identical reference signs, and repeated description thereof is sometimes omitted or simplified.

Furthermore, various elements illustrated in the drawings are merely schematically illustrated for understanding of the present disclosure, and dimensional ratios, outer appearance, and the like of the elements can be different from real ones.

Assume herein that a light receiving side of an imaging device is an "upper side" and a side opposite to the light receiving side is a "lower side". The same applies to "uppermost surface" and "lower surface" of each member. Specifically, it is assumed that a surface on the light receiving side of the imaging device is an "uppermost surface", and a surface on the side opposite to the light receiving side is a "lower surface". Note that the terms such as "upper side", "lower side", "uppermost surface", and "lower surface" are merely used to denote a relative positional relationship between members and are not intended to restrict a posture of the imaging device during use.

An imaging device according to an aspect of the present disclosure has, in an upper layer, a photoelectric conversion layer that converts light into an electric signal, i.e., performs photoelectric conversion and has, in a lower layer, a signal processing circuit part including a silicon-base complementary metal oxide semiconductor (CMOS) circuit that extracts an electric signal obtained by the photoelectric conversion part to an outside. Since the imaging device according to the aspect of the present disclosure is arranged such that the photoelectric conversion part and the signal processing circuit part are stacked as described above, the photoelectric conversion part and the signal processing circuit part can be designed independently.

Embodiment

An overall configuration of an imaging device according to the present embodiment is described with reference to FIGS. 1 and 2.

Figure 1:
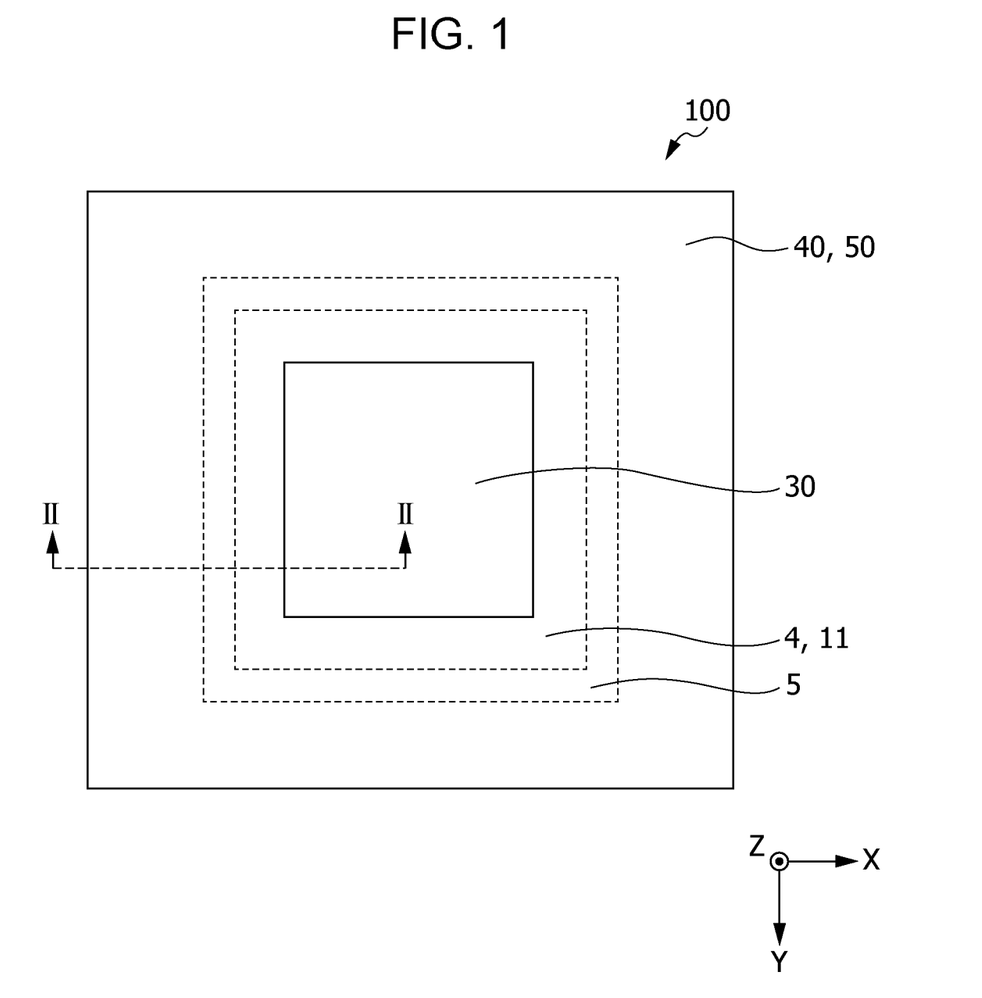
FIG. 1 is a view for explaining an example of a planar structure of an imaging device according to an embodiment.

FIG. 1 is a view for explaining an example of a planar structure of an imaging device 100 according to the present embodiment. FIG. 2 is a schematic cross-sectional view taken along line II-II of FIG. 1.

Figure 2:
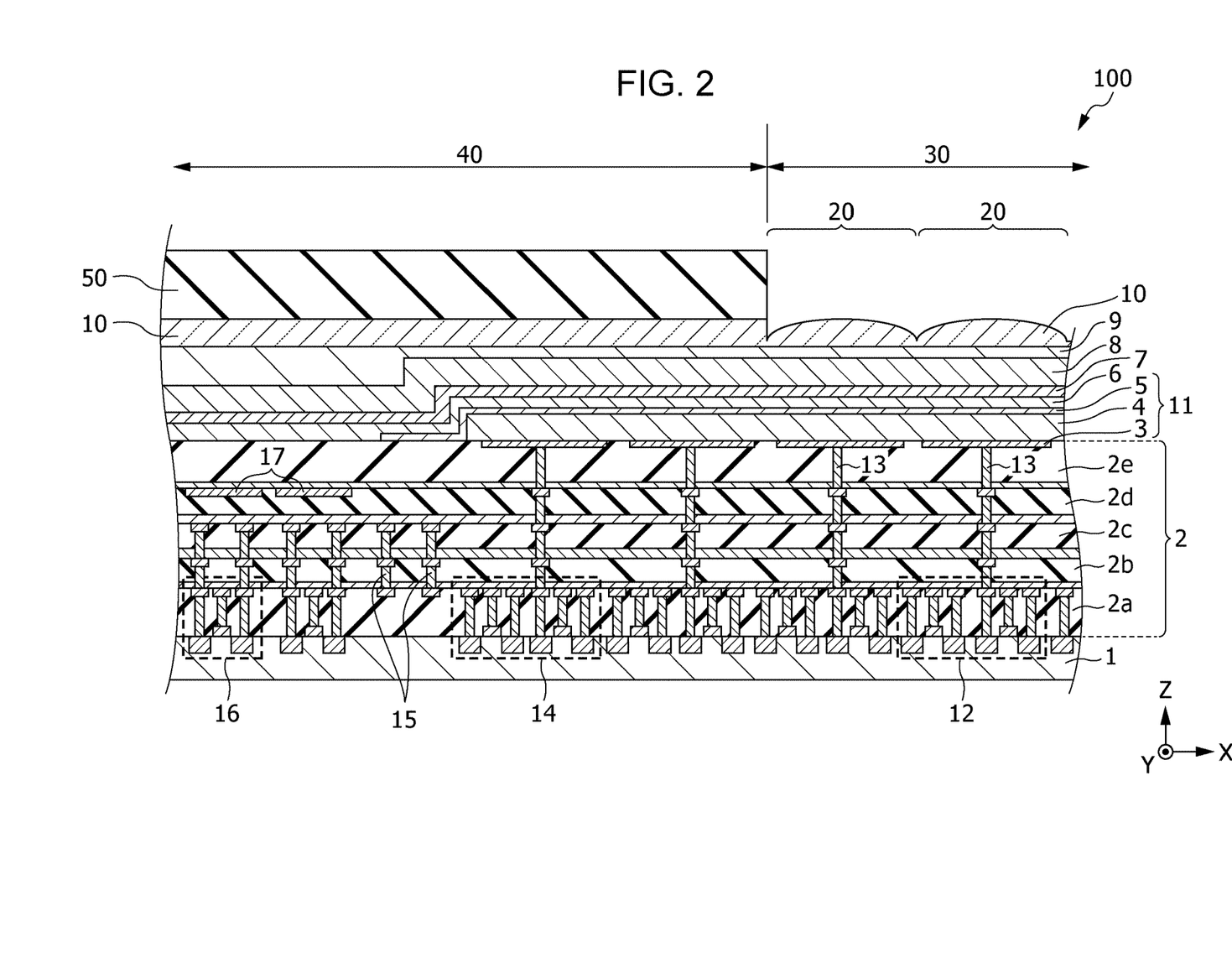
FIG. 2 is a schematic cross-sectional view taken along line II-II of FIG. 1.

As illustrated in FIGS. 1 and 2, the imaging device 100 includes a semiconductor substrate 1, and a pixel part 30 and a peripheral part 40 that are provided on the semiconductor substrate 1. The pixel part 30 includes a plurality of pixels 20 for detecting an intensity of incident light that are arranged in a matrix. The peripheral part 40 is disposed so as to surround the pixel part 30 in a plan view and includes a peripheral circuit. Furthermore, the imaging device 100 includes a protection film 50 that is provided on a positive side (hereinafter referred to as an upper side) in a Z-axis direction of the peripheral part 40 only. OB pixels (also called dummy pixels) used to set a zero luminance standard may be disposed in the peripheral part 40 separately from the plurality of pixels 20. A light shielding film (not illustrated in FIG. 2) may be provided on the OB pixels. A region of a surface of the semiconductor substrate 1 where the pixel part 30 is disposed and a region of the surface of the semiconductor substrate 1 where the peripheral part 40 is disposed are sometimes referred to as a pixel region and a peripheral region, respectively.

An upper main surface (hereinafter referred to as an uppermost surface) of the protection film 50 is located higher than an uppermost surface of the pixel part 30.

In a stacked organic imaging device, for example, a photoelectric conversion layer is formed by vacuum vapor deposition. In a case where a pattern of a photoelectric conversion layer is formed, a shadow mask such as a metal mask opened at a position where the photoelectric conversion layer is to be formed is used. In a case where a foreign substance is on the mask, the foreign substance is sometimes transferred onto a wafer in a peripheral part. For this reason, in a conventional stacked organic imaging device, unevenness is sometimes created on an uppermost surface of a peripheral part due to a foreign substance. In a case where unevenness is created on the uppermost surface of the peripheral part, the foreign substance is sometimes detached from the wafer upon application of external force in a later step. In a case where the foreign substance is detached from the wafer, there is a risk of decrease in adhesion between layers that are adjacent with the foreign substance interposed therebetween or occurrence of delamination due to the decrease in adhesion. In the present embodiment, the protection film 50 covers the uppermost surface of the peripheral part 40 only, and thus unevenness on the uppermost surface of the peripheral part 40 that is created by attachment of the foreign substance can be flattened. This can make occurrence of a defect such as film peeling less likely.

As illustrated in FIG. 2, each of the plurality of pixels 20 includes a photoelectric conversion part 11 including a lower electrode 3, an upper electrode 5 facing the lower electrode 3, and a photoelectric conversion layer 4 located between the lower electrode 3 and the upper electrode 5. In the present embodiment, dummy pixels are provided in the peripheral part 40, and the dummy pixels overlap the protection film 50 in a plan view. That is, the photoelectric conversion part 11 extends to a position that overlaps the protection film 50 in a plan view. More specifically, the photoelectric conversion part 11 extends from the pixel part 30 toward the peripheral part 40 so as to overlap the protection film 50. A peripheral part of the photoelectric conversion part 11 is covered with the protection film 50. Since the peripheral part of the photoelectric conversion part 11 is covered with the protection film 50, adhesion among the upper electrode 5, the photoelectric conversion layer 4, the lower electrode 3, and an insulating layer 2 can be improved.

Although an example in which the photoelectric conversion part 11 extends to a position that overlaps the protection film 50 in a plan view has been described in the present embodiment, the photoelectric conversion part 11 may be disposed so as not to extends to a position that overlaps the protection film 50 in a plan view. For example, in a case where the photoelectric conversion part 11 is disposed within the pixel part 30, the photoelectric conversion part 11 does not overlap the protection film 50 in a plan view. In this case, in a case where the upper electrode 5 extends to an outside of the photoelectric conversion part 11, i.e., in a case where the upper electrode 5 has a larger area than the photoelectric conversion layer 4 and the pixel part 30 in a plan view, the protection film 50 overlaps the upper electrode 5 in a plan view. An organic semiconductor material used in the photoelectric conversion layer has small adhesive force with the lower electrode 3, the insulating layer 2, and the upper electrode 5. Therefore, by covering the whole photoelectric conversion layer 4 with the upper electrode 5, adhesion among the upper electrode 5, the photoelectric conversion layer 4, the lower electrode 3, and the insulating layer 2 can be improved. Furthermore, in a case where the peripheral part of the upper electrode 5 overlaps the protection film 50 in a plan view, adhesion among the upper electrode 5, the photoelectric conversion layer 4, the lower electrode 3, and the insulating layer 2 can be further improved.

In the pixel part 30, a detection circuit 12 is provided corresponding to each pixel 20 in the semiconductor substrate 1 and the insulating layer 2. The lower electrode 3 is provided on a main surface on a positive side (hereinafter referred to as an upper side) in the Z-axis direction of the insulating layer 2, i.e., on an upper surface of the insulating layer 2. The lower electrode 3 is coupled to a corresponding detection circuit 12 via a connection part 13.

In the present embodiment, the photoelectric conversion part 11 is disposed so as to extend to a position that overlaps the protection film 50. In this case, also in the peripheral part 40, the lower electrode 3 is coupled to a corresponding circuit 14 via the connection part 13. The photoelectric conversion part 11 and the circuit 14 in the peripheral part 40 are, for example, used to set a standard such as zero luminance.

The plurality of pixels 20 are arranged two-dimensionally on the semiconductor substrate 1 so as to constitute the pixel part 30. The plurality of pixels 20 are arranged in row and column directions (not illustrated). In FIG. 1, the X-axis direction is the row direction, and the Y-axis direction is the column direction. The plurality of pixels 20 may be disposed so that a center of each of the pixels 20 is located at a grid point of a square grid. Alternatively, the plurality of pixels 20 may be disposed so that a center of each of the pixels 20 is located at a grid point of a triangular grid, a hexagonal grid, or the like. The plurality of pixels 20 may be arranged one-dimensionally. In this case, the imaging device can be used as a line sensor. The plurality of pixels receive incident light and detect an intensity of the incident light.

The lower electrode 3 is an electrode for collecting an electric charge generated by the photoelectric conversion layer 4. The lower electrode 3 is, for example, made of a metal material such as titanium nitride (TiN). The lower electrode 3 may be made of copper (Cu), tungsten (W), titanium (Ti), tantalum (Ta), aluminum (Al), or a compound thereof. Each of the plurality of lower electrodes 3 has a uniform thickness and has a flat upper surface.

The lower electrodes 3 are arranged two-dimensionally in the row and column directions on the upper surface of the insulating layer 2. The plurality of lower electrodes 3 are, for example, arranged in a matrix on the upper surface of the insulating layer 2 at constant intervals. In a case where the plurality of pixels 20 are arranged in a matrix, the plurality of lower electrodes 3 are arranged in a matrix in a manner corresponding to the way in which the pixels 20 are arranged. In a case where the plurality of pixels 20 are arranged one-dimensionally, the plurality of lower electrodes 3 are arranged one-dimensionally in a manner corresponding to the way in which the pixels 20 are arranged.

The detection circuit 12 is provided corresponding to each of the plurality of lower electrodes 3, and detects a signal electric charge collected by a corresponding lower electrode 3 and outputs a signal voltage according to the electric charge. The detection circuit 12 is, for example, constituted by a metal oxide semiconductor (MOS) circuit or a thin film transistor (TFT) circuit. The detection circuit 12 includes, for example, an amplification transistor that has a gate coupled to the lower electrode 3, and the amplification transistor outputs a signal voltage corresponding to a signal electric charge. The detection circuit 12 is blocked from light by a light shielding layer (not illustrated) provided, for example, in the insulating layer 2.

The connection part 13 couples the lower electrode 3 of each pixel 20 to a corresponding detection circuit 12. The connection part 13 is formed, for example, by embedding a conductive material such as copper (Cu) or tungsten (W) in the insulating layer 2.

The insulating layer 2 is provided on the semiconductor substrate 1 and includes a plurality of constituent layers 2a, 2b, 2c, 2d, and 2e (hereinafter referred to as 2a to 2e). The semiconductor substrate 1 is, for example, made of silicon (Si). The plurality of constituent layers 2a to 2e are, for example, made of silicon dioxide ($SiO_2$)). For example, a wiring layer including a wire, a contact plug is disposed in each of the constituent layers 2a to 2e. The number of constituent layers of the insulating layer 2 can be set to any number and is not limited to the example in which the five constituent layers 2a to 2e are provided as illustrated in FIG. 2.

In the peripheral part 40, a plurality of connection parts 15, a wire 17, and a transistor 16 that constitutes part of a peripheral circuit are disposed in the insulating layer 2.

The photoelectric conversion layer 4 is stacked on an upper surface of the constituent layer 2e in which the lower electrodes 3 are disposed. Furthermore, the upper electrode 5, a buffer layer 6, and a sealing layer 7 are stacked in this order on an upper surface of the photoelectric conversion layer 4. A color filter 8 having a transmission wavelength band corresponding to each pixel 20 is provided on an upper surface of the sealing layer 7. Furthermore, microlenses 10 are provided on an upper surface of the color filter 8 with a planarizing layer 9 interposed therebetween. In the pixel part 30, the microlenses 10 each having a curved surface are provided corresponding to the respective pixels 20. A layer of a material for the microlenses 10 may be provided as a flat layer in the peripheral part 40. In this case, the microlenses 10 provided corresponding to the respective pixels 20 in the pixel part 30 and the layer of the material for the microlenses 10 provided in the peripheral part 40 are a single continuous layer. A thickness of each of the microlenses 10 in the respective pixels 20 may be, for example, 0.1 μm or more and 3 μm or less. The thickness of each of the microlenses 10 in the respective pixels 20 may be, for example, 0.5 μm or more and 2 μm or less. Each of the buffer layer 6, the sealing layer 7, the color filter 8, the planarizing layer 9, and the microlenses 10 stacked on the upper electrode 5 may be a layer including an insulating material.

A constituent layer of the insulating layer 2 is located in a gap between adjacent lower electrodes 3.

The photoelectric conversion layer 4 is a layer made of a photoelectric conversion material that generates an electric charge in accordance with an intensity of received light. The photoelectric conversion layer 4 is sandwiched between the lower electrode 3 and the upper electrode 5. The photoelectric conversion material is, for example, an organic semiconductor material and includes at least one of a p-type organic semiconductor and an n-type organic semiconductor.

It is desirable that the photoelectric conversion layer 4 have a uniform thickness in the pixel part 30. A thickness of the photoelectric conversion layer 4 may be, for example, not 0.1 μm or more and 2 μm or less. The thickness of the photoelectric conversion layer 4 may be, for example, 0.3 μm or more and 1 μm or less.

In the present embodiment, the upper electrode 5 is disposed on a light incident side relative to the photoelectric conversion layer 4. The upper electrode 5 is an electrode facing the lower electrode 3. The upper electrode 5 desirably has transparency so as to allow light to be incident on the photoelectric conversion layer 4. For example, a transparent oxide conductive material such as indium tin oxide (ITO) or indium zinc oxide (IZO) may be used as a material for the upper electrode 5.

The protection film 50 is disposed on an upper side of the peripheral part 40 only. The protection film 50 need just be disposed so as to overlap at least a region where the photoelectric conversion layer 4 is not located in a plan view in the peripheral part 40. The protection film 50 may be disposed so as to overlap the whole peripheral part 40 in a plan view. The protection film 50 may be a layer containing an insulating material. The protection film 50 is, for example, made of silicon dioxide (SiO$_2$), silicon nitride (SiN), silicon oxynitride (SiON), an acrylic resin, polyimide, a UV adhesive, or an epoxy resin. The protection film 50 may be made of a single kind of material or may be made of two or more kinds of materials. The protection film 50 may be a single-layer film or may be a multi-layer film.

The protection film 50 may be formed by a film formation method, a lithography method, or a combination of an etching method and one of the film formation method and the lithography method. For example, the protection film 50 may be formed on an upper side of the peripheral part 40 only by forming the protection film 50 throughout the pixel part 30 and the peripheral part 40 and then etching a portion that overlaps the pixel part 30 in a plan view. For example, in a case where the protection film 50 is made of a photosensitive material such as polyimide, the protection film 50 may be formed only by lithography without performing etching. More specifically, the protection film 50 may be formed on an upper side of the peripheral part 40 only by applying a photosensitive material to the upper surface of the peripheral part 40 and then exposing the photosensitive material to light. This makes it possible to more easily form the protection film 50 at a desired position.

As described above, in the present embodiment, the protection film 50 is formed on an upper side of the peripheral part 40 only. Accordingly, the protection film 50 is different from a single layer continuous throughout the pixel part 30 and the peripheral part 40. For example, the color filter 8, the planarizing layer 9, or the layer of the material for the microlenses 10 are examples of a single continuous layer. A single continuous layer is described by taking the layer of the material for the microlenses 10 as an example. First, the layer of the material for the microlenses 10 is formed as a layer continuous throughout the pixel part 30 and the peripheral part 40. Then, in the pixel part 30, this layer is formed so as to have curved protruding parts corresponding to the respective pixels 20. In the present disclosure, the microlenses 10 and the layer of the material for the microlenses 10 are expressed as being a single continuous layer.

In the present embodiment, the protection film 50 selectively formed on an upper side of the peripheral part 40 is provided separately from a layer continuous throughout the pixel part 30 and the peripheral part 40. However, the protection film 50 and the layer continuous throughout the pixel part 30 and the peripheral part 40 may be a single continuous layer. That is, a layer that is continuous throughout the pixel part 30 and the peripheral part 40 and whose thickness in a portion corresponding to the peripheral part 40 is larger than a thickness of a portion corresponding to the pixel part 30 may be provided. An uppermost surface of such a single continuous layer in the peripheral part 40 may be located higher than an uppermost surface of such a single continuous layer in the pixel part 30. A similar effect can be obtained even by such a configuration.

The protection film 50 may be made of a material having low reflectance. In a case where the protection film 50 has low reflectance, light incident on the imaging device is harder to be reflected by the surface of the protection film 50. This makes it possible to make occurrence of a ghost less likely. In this case, the protection film 50 may be a layer that has low light reflectance and high optical transmittance or may be a layer that has low light reflectance and low optical transmittance.

For example, the protection film 50 may be configured such that plural layers including a high-refractive-index layer and a low-refractive-index layer are stacked, may be configured such that particles such as filler is mixed in a resin, or may be configured such that a pigment or the like is mixed in a resin.

The protection film 50 is not limited to the above configuration example. Light transmittance of the protection film 50 can be adjusted in accordance with design. This makes it possible to reduce influence of light entering a circuit disposed in the peripheral part 40. In this case, for example, the protection film 50 may have small transmittance of light in a visible light region of a wavelength of 380 nm or more and 780 nm or less. The expression "small light transmittance" as used herein refers to a case where light transmittance is 50% or more. More specifically, light transmittance of the protection film 50 in a wavelength region of 400 nm or more and 600 nm or less may be 20% or less.

The protection film 50 may have a function as a light shielding layer. This makes it possible to further reduce influence of light on a circuit disposed in the peripheral part 40. Furthermore, a region where the protection film 50 is located may be used as an optical black region. This makes it possible to omit a step of providing a light shielding layer in order to provide an optical black region, thereby improving production efficiency.

An uppermost surface of the protection film 50 is located higher than an uppermost surface of the pixel part 30. That is, a level of an uppermost surface of the protection film 50 is higher than a level of an uppermost surface of the pixel part 30. The uppermost surface of the pixel part 30 may be, for example, uppermost surfaces of the microlenses 10. Although an example in which the imaging device 100 includes the color filter 8 and the microlenses 10 has been described in the present embodiment, the present embodiment is not limited to this. For example, an imaging device according to the present disclosure may include either the color filter 8 or the microlenses 10, or may include neither the color filter 8 nor the microlenses 10. In a case where the imaging device includes neither the color filter 8 nor the microlenses 10, the uppermost surface of the pixel part 30 may be, for example, an uppermost surface of the planarizing layer 9.

In this case, a thickness of the protection film 50 is larger than a thickness of the photoelectric conversion layer 4. In a case where the microlenses 10 located above the photoelectric conversion part 11 are provided as in the imaging device 100 according to the present embodiment, a thickness of the protection film 50 is larger than a thickness of the microlenses 10. More specifically, the thickness of the protection film 50 is desirably several μm or more and several tens of μm or less. The thickness of the protection film 50 may be, for example, 3 μm or more and 20 μm or less. The thickness of the protection film 50 may be, for example, 3 μm or more and 10 μm or less. Alternatively, the thickness of the protection film 50 may be, for example, 5 μm or more. Since a size of a foreign substance is approximately 1 μm to 10 μm, a foreign substance can be sufficiently covered and a defect such as film peeling can be made less likely to occur in a case where the thickness of the protection film 50 is 5 μm or more. In the present embodiment, the lower electrode 3 exemplifies the first electrode, and the upper electrode 5 exemplifies the second electrode. An entire laminated structure from the buffer layer 6 to protection film 50 exemplifies the first layer. Among the entire laminated structure, a laminated structure from the buffer layer 6 to the layer of the material for the microlenses 10 exemplifies the second layer, and the protection film 50 exemplifies the third layer.

The above structure of the imaging device 100 according to the present embodiment allows a foreign substance present in the peripheral part 40 to be covered with the protection film 50. This keeps the foreign substance from being exposed on a surface of the peripheral part 40 and keeps the upper surface of the peripheral part 40 from becoming uneven. That is, it is possible to cover the foreign substance present in the peripheral part 40 and flatten the surface of the peripheral part 40. As described above, the protection film 50 does not cover the pixel part 30 and covers only the peripheral part 40. If the protection film 50 covers part of the pixel part 30, there is a possibility of occurrence of a difference in pixel properties between a pixel 20 that is covered with the protection film 50 and a pixel 20 that is not covered with the protection film 50. Meanwhile, in a case where the protection film 50 is formed only on an upper side of the peripheral part 40, pixel properties are less affected. Furthermore, since the surface of the peripheral part 40 is flattened, a defect such as film peeling can be made less likely to occur. Furthermore, occurrence of a ghost can be made less likely since diffused reflection of incident light on the upper surface of the peripheral part 40 can be also made less likely to occur.

In a case where the protection film 50 is disposed on the whole peripheral part 40, the whole surface of the peripheral part 40 can be flattened, and therefore diffused reflection on the surface of the peripheral part 40 can be made less likely to occur. This makes it possible to make occurrence of flare less likely, thereby improving optical properties of the imaging device.

In a case where a peripheral part of the photoelectric conversion part 11 is covered with the protection film 50, a region located in the pixel part 30 and a region located in the peripheral part 40 in FIG. 2 may be referred to as a first region and a second region, respectively. The second region is a region that overlaps the protection film 50 in a plan view and is a region that overlaps the peripheral part of the photoelectric conversion part 11 in a plan view. The peripheral part of the photoelectric conversion part 11 is used to set a standard such as zero luminance. In this case, the imaging device includes the semiconductor substrate 1 and the photoelectric conversion part 11 that is located above the semiconductor substrate 1 and includes the lower electrode 3, the upper electrode 5 facing the lower electrode 3, and the photoelectric conversion layer 4 located between the lower electrode 3 and the upper electrode 5; the imaging device has a first region and a second region that surrounds the first region; the photoelectric conversion part 11 covers the first region and the second region in a plan view; the imaging device includes the protection film 50 that overlaps the second region in a plan view; and the uppermost surface of the protection film 50 is higher than the uppermost surface of the imaging device in the first region.

The imaging device according to the present disclosure has been described above on the basis of the embodiment, but the present disclosure is not limited to the above embodiment. Other embodiments realized by combining any constituent elements in the above embodiment, various modifications of the above embodiment which a person skilled in the art can think of without departing from the spirit of the present disclosure, and various apparatuses including the imaging device according to the present disclosure are also encompassed within the range of the present disclosure.

Although an imaging device has been described in the above embodiment, the imaging device according to the present disclosure may be used in a camera system.

Figure 3:
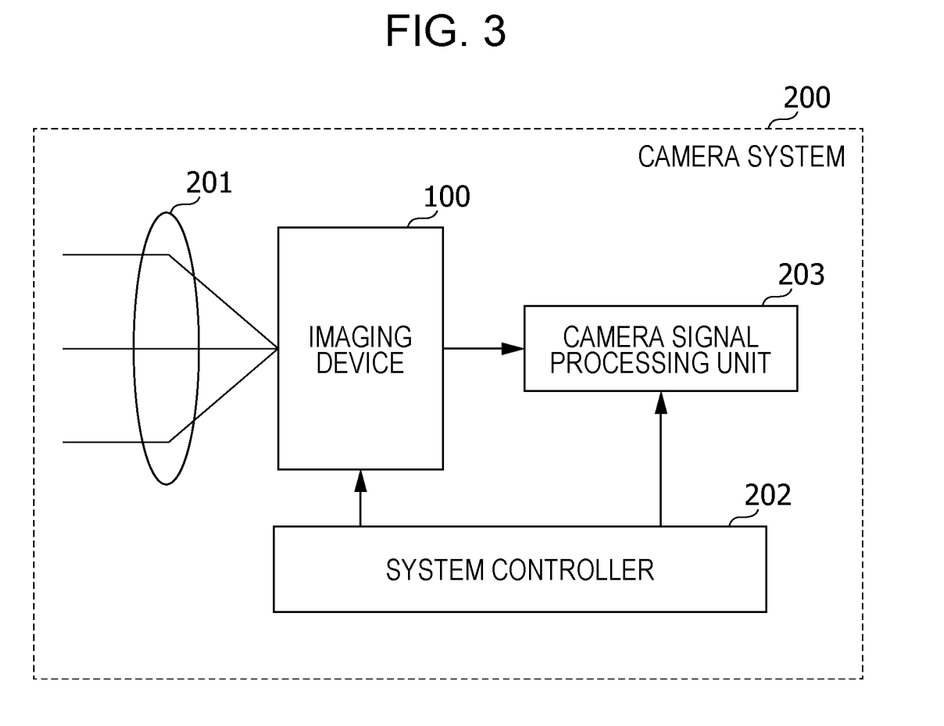
FIG. 3 illustrates an example of a camera system including an imaging device according to the present disclosure.

FIG. 3 illustrates an example of a camera system including the imaging device according to the present disclosure. The following describes a camera system 200 including the imaging device 100 according to the embodiment.

The camera system 200 includes a lens optical system 201, the imaging device 100, a system controller 202, and a camera signal processing unit 203. The lens optical system 201 includes, for example, a lens for autofocus, a lens for zoom, and a diaphragm. The lens optical system 201 focuses light onto an imaging surface of the imaging device 100. The system controller 202 can be, for example, a microcomputer. The camera signal processing unit 203 functions as a signal processing circuit that performs signal processing on data captured by the imaging device 100 and outputs the data as an image or data. The camera signal processing unit 203 performs, for example, processing such as gamma correction, color interpolation, spatial interpolation, and white balance. The camera signal processing unit 203 can be, for example, a digital signal processing (DSP).

An imaging device according to an aspect of the present disclosure can make a defect such as film peeling less likely to occur. Therefore, use of the imaging device 100 allows the camera system 200 to be produced with high yield.

The imaging device according to the present disclosure can be used for various camera systems and sensor systems such as a digital still camera, a camera for medical use, a surveillance camera, a vehicle-mounted camera, a digital single-lens reflex camera, and a mirrorless interchangeable lens camera.

What is claimed is:

1. An imaging device comprising:
   a semiconductor substrate that includes a pixel region where pixels are arranged and a peripheral region adjacent to the pixel region;
   an insulating layer that covers the pixel region and the peripheral region;
   a first electrode that is located on the insulating layer above the pixel region;
   a photoelectric conversion layer that covers the first electrode;
   a second electrode that covers the photoelectric conversion layer; and
   a first layer that covers the second electrode, the first layer being located above the pixel region and the peripheral region, wherein
   a thickness of the first layer above the peripheral region is larger than a thickness of the first layer above the pixel region, and
   a level of an uppermost surface of the first layer above the peripheral region is higher than a level of an uppermost surface of the first layer above the pixel region.

2. The imaging device according to claim 1, wherein a thickness of the first layer above a part of the peripheral region is larger than the thickness of the first layer above the pixel region, the part not overlapping the photoelectric conversion layer in a plan view.

3. The imaging device according to claim 1, wherein the pixels are configured to detect an intensity of incident light.

4. The imaging device according to claim 1, further comprising
   a detection circuit that is coupled to the first electrode and that is configured to detect a signal from the first electrode.

5. The imaging device according to claim 1, further comprising
   an amplification transistor having a gate coupled to the first electrode.

6. The imaging device according to claim 1, further comprising
   a microlens that is located above the second electrode above the pixel region, wherein
   the level the uppermost surface of the first layer above the peripheral region is higher than a level of an uppermost surface of the microlens.

7. The imaging device according to claim 1, wherein the level of the uppermost surface of the first layer above the peripheral region is higher than levels of uppermost surfaces of the pixels on the pixel region.

8. The imaging device according to claim 1, wherein the first layer includes:
   a second layer that covers the pixel region and the peripheral region, and
   a third layer that is located on the second layer, the third layer covering the peripheral region and not covering the pixel region.

9. The imaging device according to claim 8, wherein the second layer includes a plurality of layers.

10. The imaging device according to claim 8, wherein the second layer includes a layer that constitutes a color filter.

11. The imaging device according to claim 8, wherein the second layer includes a layer that constitutes a microlens.

12. The imaging device according to claim 8, wherein the third layer includes a plurality of layers.

13. The imaging device according to claim 8, wherein
    the photoelectric conversion layer extends above the peripheral region; and
    the third layer overlaps the photoelectric conversion layer in a plan view.

14. The imaging device according to claim 8, wherein a thickness of the third layer is larger than a thickness of the photoelectric conversion layer.

15. The imaging device according to claim 8, further comprising
    a microlens located above the pixel region, wherein
    a thickness of the third layer is larger than a thickness of the microlens.

16. The imaging device according to claim 8, wherein light transmittance of the third layer in a wavelength range of 400 nm or more and 600 nm or less is 20% or less.

17. The imaging device according to claim 8, wherein a thickness of the third layer is 3 μm or more and 20 μm or less.

* * * * *